United States Patent
Bergmann et al.

(10) Patent No.: US 9,601,651 B2
(45) Date of Patent: Mar. 21, 2017

(54) METHOD AND APPARATUS FOR MANUFACTURING A SOLAR MODULE STRAND AND A SOLAR MODULE STRAND OF FLEXIBLE SOLAR CELLS

(71) Applicant: MUEHLBAUER AG, Roding (DE)

(72) Inventors: Dieter Bergmann, Dresden (DE);
Klaus Schlemper, Dresden (DE);
Volker Brod, Bad Abbach/Lengfeld (DE); Gerald Niklas, Zell-Beucherling (DE)

(73) Assignee: Muehlbauer GmbH & Co. KG, Roding (DE)

( * ) Notice: Subject to any disclaimer, the term of this patent is extended or adjusted under 35 U.S.C. 154(b) by 923 days.

(21) Appl. No.: 13/923,910

(22) Filed: Jun. 21, 2013

(65) Prior Publication Data

US 2014/0373892 A1    Dec. 25, 2014

(51) Int. Cl.
*H01L 21/00* (2006.01)
*H01L 31/18* (2006.01)
*H01L 31/02* (2006.01)
*H01L 31/05* (2014.01)

(52) U.S. Cl.
CPC ......... *H01L 31/18* (2013.01); *H01L 31/0201* (2013.01); *H01L 31/0504* (2013.01); *H01L 31/188* (2013.01); *Y02E 10/50* (2013.01); *Y10T 156/1734* (2015.01)

(58) Field of Classification Search
CPC .... H01L 31/18; H01L 31/0201; H01L 31/188
See application file for complete search history.

(56) References Cited

U.S. PATENT DOCUMENTS 3,654,036 A * 4/1972 Paine ................. B26D 1/04
                                                        156/250
4,430,519 A   2/1984 Young
4,492,181 A * 1/1985 Ovshinsky ............ C23C 16/505
                                                        118/718

(Continued)

FOREIGN PATENT DOCUMENTS

CN     104241442 A  *  12/2014
DE     103 45 576 A1    5/2005

(Continued)

*Primary Examiner* — Laura Menz
(74) *Attorney, Agent, or Firm* — John A. Miller; Miller IP Group, PLC

(57) ABSTRACT

A flexible solar module strand manufactured by a method including providing a first conveyor track for applying flexible solar cells; guiding the first conveyor track around two or more deflecting means; providing individual flexible solar cells; applying the individual solar cells to the first conveyor track; deflecting the first conveyor track by guiding the first conveyor track over a first one of the deflecting means; separating the first conveyor track from the at least one deflected solar cell strip in such a manner that the solar cells are released, with their respective first or second sides facing the first conveyor track, from the first conveyor track; and applying the at least one deflected solar cell strip to a first film web in such a manner that the solar cells are oriented, with their respective first or second sides separated from the first conveyor track, away from the first film web.

32 Claims, 4 Drawing Sheets

(56) References Cited

U.S. PATENT DOCUMENTS

| | | | | |
|---|---|---|---|---|
| 4,534,502 A | * | 8/1985 | Piurek | H01L 21/67138 |
| | | | | 136/244 |
| 4,562,637 A | | 1/1986 | Kushima | |
| 4,617,421 A | | 10/1986 | Nath et al. | |
| 4,685,608 A | * | 8/1987 | Kujas | B23K 1/002 |
| | | | | 136/244 |
| 5,270,248 A | * | 12/1993 | Rosenblum | C23C 26/02 |
| | | | | 136/261 |
| 8,330,472 B2 | * | 12/2012 | Niklas | G01N 22/00 |
| | | | | 324/637 |
| 8,796,064 B2 | * | 8/2014 | Brod | B32B 37/206 |
| | | | | 29/742 |
| 2007/0045831 A1 | * | 3/2007 | Wong | H01L 21/67092 |
| | | | | 257/724 |
| 2008/0061111 A1 | * | 3/2008 | Kiriyama | H01L 31/188 |
| | | | | 228/47.1 |
| 2010/0141271 A1 | * | 6/2010 | Niklas | G01N 22/00 |
| | | | | 324/637 |
| 2012/0103383 A1 | * | 5/2012 | Shufflebotham | B32B 37/226 |
| | | | | 136/244 |
| 2013/0019920 A1 | * | 1/2013 | Kinsey | H01L 31/0543 |
| | | | | 136/246 |
| 2013/0052773 A1 | * | 2/2013 | Brod | B32B 37/206 |
| | | | | 438/80 |
| 2013/0122616 A1 | * | 5/2013 | Degroot | H01L 22/14 |
| | | | | 438/17 |
| 2013/0122639 A1 | * | 5/2013 | Degroot | H01L 31/188 |
| | | | | 438/80 |
| 2014/0373892 A1 | * | 12/2014 | Bergmann | H01L 31/18 |
| | | | | 136/244 |

FOREIGN PATENT DOCUMENTS

| | | | | |
|---|---|---|---|---|
| DE | 10 2008 046 327 A1 | | 3/2010 | |
| DE | 102010015740 | * | 10/2011 | B32B 37/206 |
| DE | WO 2011131345 A1 | * | 10/2011 | B32B 37/206 |
| DE | WO 2011131346 A2 | * | 10/2011 | B32B 37/206 |
| DE | WO 2013124438 A2 | * | 8/2013 | B32B 37/206 |
| EP | 0 095 843 A2 | | 12/1983 | |
| EP | 0 111 394 A2 | | 6/1984 | |
| JP | 2013089885 A | * | 5/2013 | |
| JP | 2013193316 A | * | 9/2013 | |

* cited by examiner

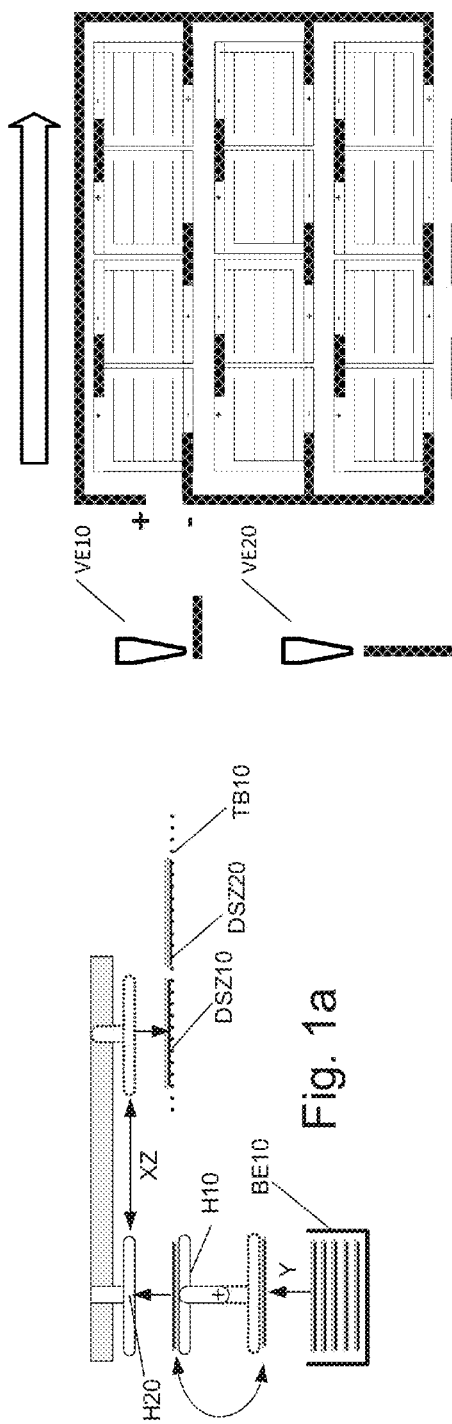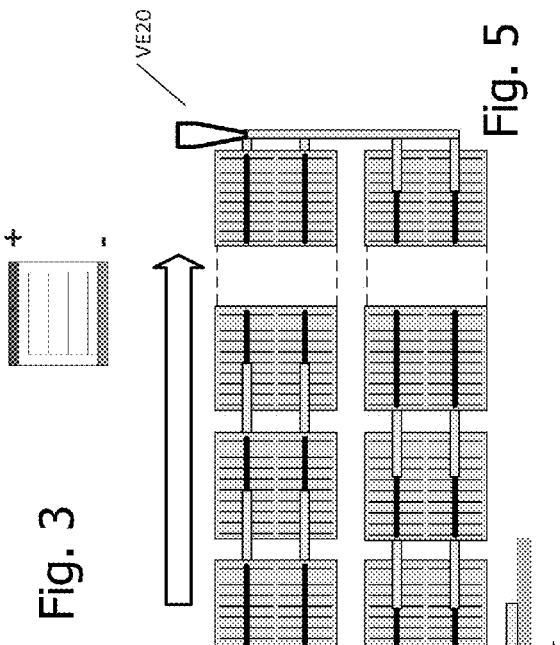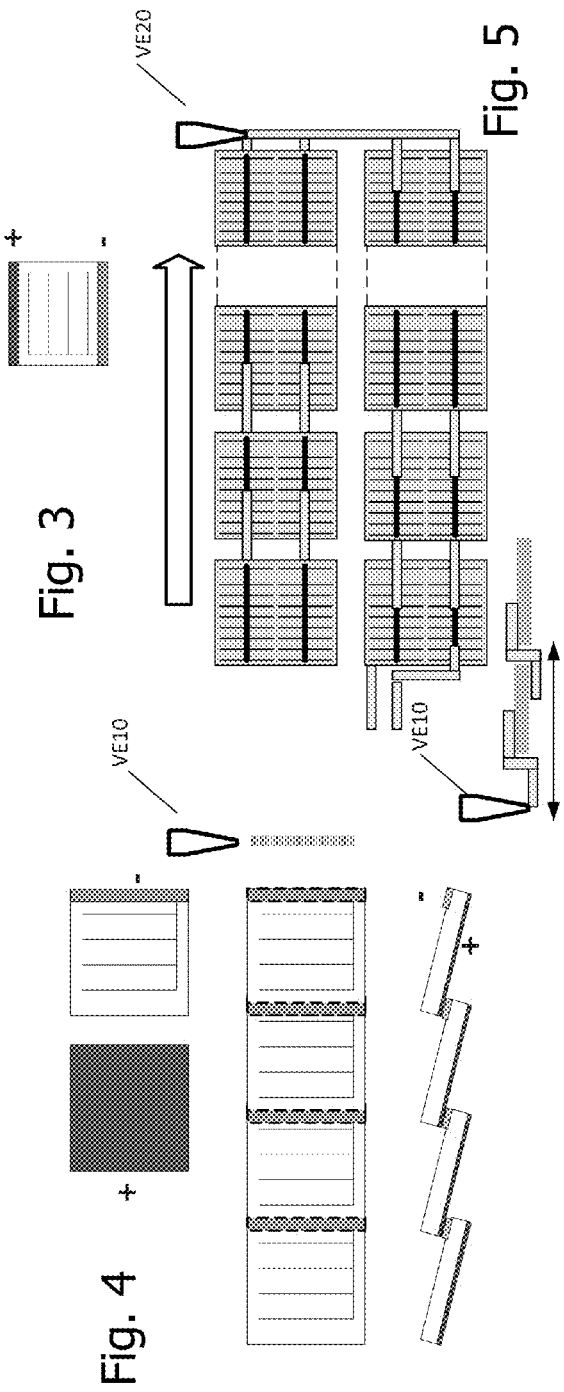

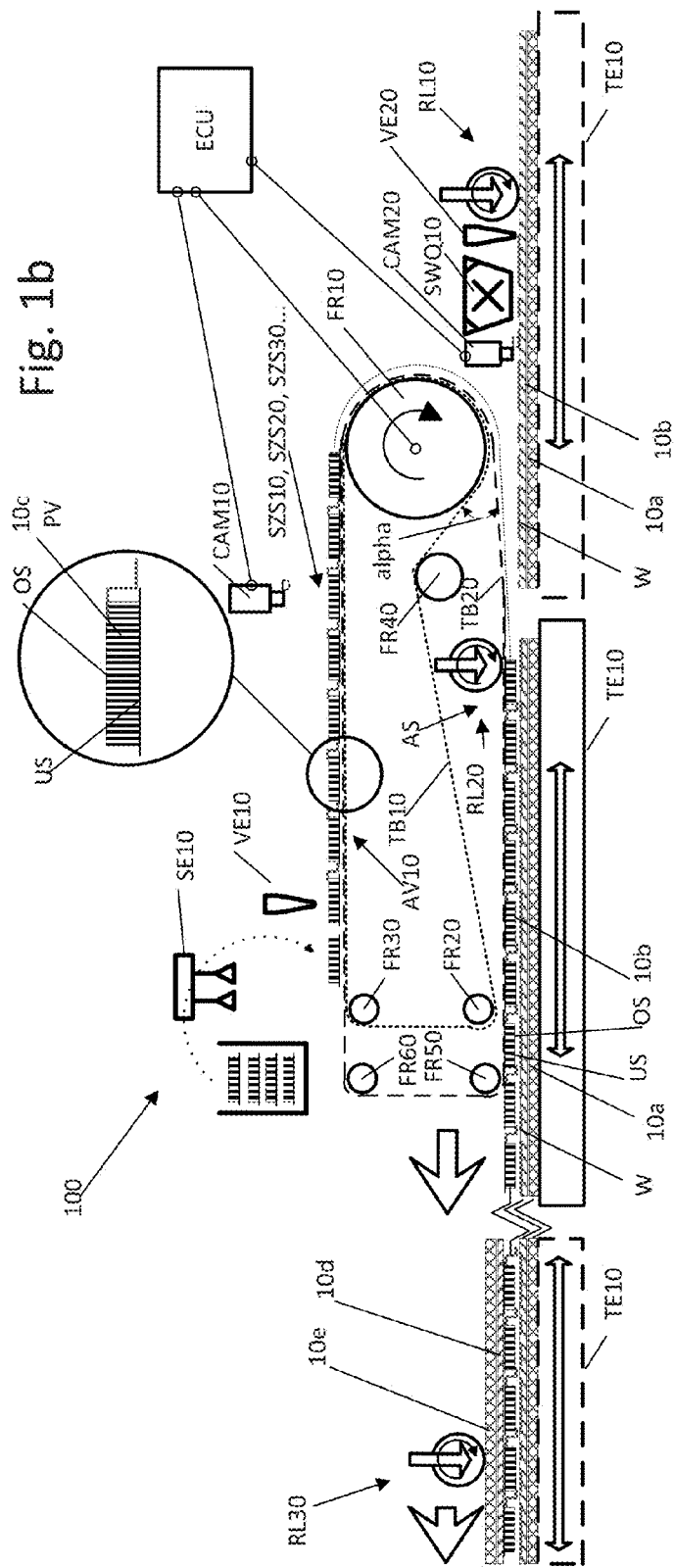

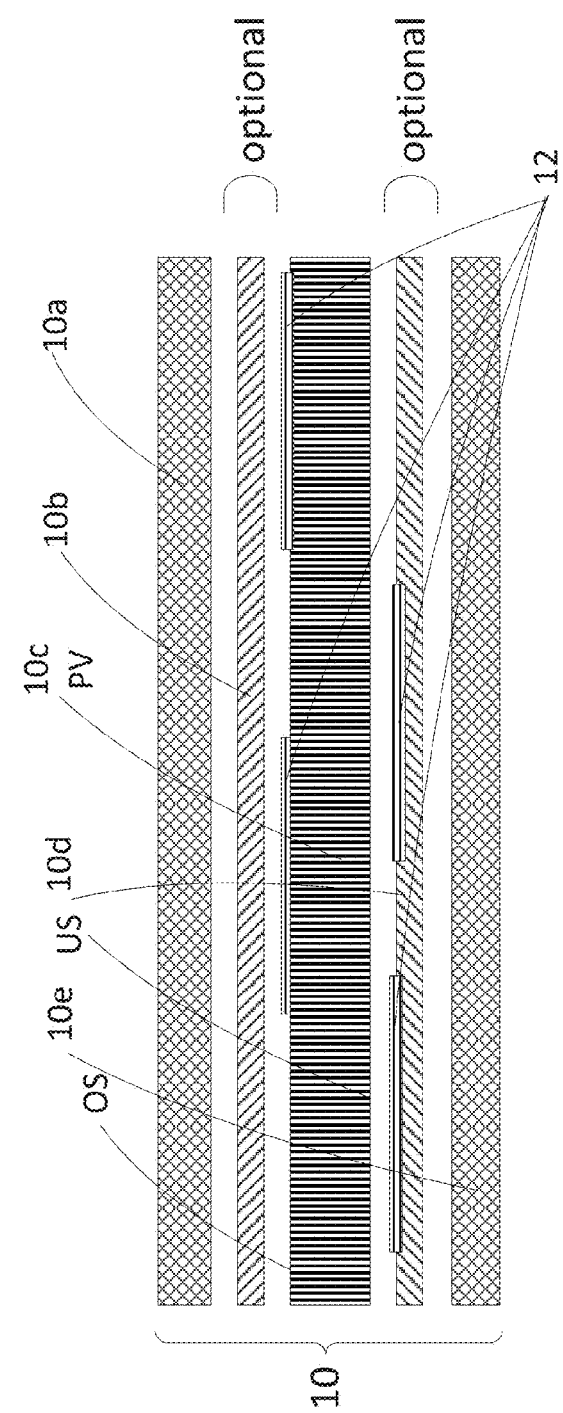

METHOD AND APPARATUS FOR MANUFACTURING A SOLAR MODULE STRAND AND A SOLAR MODULE STRAND OF FLEXIBLE SOLAR CELLS

BACKGROUND

A method and apparatus for manufacturing a solar module strand comprising flexible solar cells, in particular, flexible solar cells based on thin-film technologies ($2^{nd}$ generation of solar technologies) or organic solar technologies (so-called $3^{rd}$ generation) is described herein, as well as a solar module strand manufactured using such an apparatus/according to such a method. The approach described herein, the corresponding apparatus for manufacturing a solar module strand and the resulting product, i.e. the solar module, can also be realized with rigid solar cells (for example, silicon solar cells) instead of the flexible solar cells explained in detail herein.

Solar or photovoltaic modules (also of the kind described herein) directly convert incident sunlight into electrical energy. As the most important components, a solar module comprises a plurality of solar cells. Each one of the solar cells comprises a rear side facing away from a light energy source in operation and a front side facing the light energy source in operation. The solar module is characterized, from an electrical point of view, by its electrical connection values (in particular, open-circuit voltage and short-circuit current) and, from a mechanical point of view, by its dimensions (especially length and width). The electrical connection values and the dimensions are dependent on the properties of the individual solar cells and the type and quality of the interconnection of the solar cells within the solar module.

In a solar module, also of the kind described herein, the solar cells electrically interconnected to each other are usually accommodated between a transparent front-side layer and a rear-side construction. The front-side layer and the rear-side construction have barrier properties and serve the purpose of protection from mechanical and climatic influences, e.g. also from moisture and oxygen. Furthermore, they serve as a mechanical protection during assembly of the solar modules and as an electrical insulation. The rear-side construction can be made of glass or a flexible composite film.

Inter alia for reasons of efficient assembly and low-maintenance operation, solar modules comprising solar cell strings or solar cell strips, which are usually fully electrically interconnected arrangements of a plurality of solar cells, with very large mechanical dimensions (length, width) and high electrical connection values are aimed at. Here, a great number of solar cells are interconnected in series or in parallel to form a solar cell strip/solar cell string. However, handling of the solar cell strips during manufacture of a solar module/solar module strand having very large dimensions is difficult. In particular, reversing and (fully) interconnecting, if applicable, long solar cell strings of several meters in length or in form of continuous material is not possible when using conventional manufacturing technology. Currently available manufacturing systems usually employ placement robots and permit limited dimensions within a range of up to approx. 2-3 meters maximum edge length of the solar modules and their solar cell strips.

PRIOR ART

Specifically, the following arrangements are, inter alia, known for this purpose:

DE 10 2008 046 327 A1 relates to an arrangement of a plurality of production apparatuses as a facility for the processing of solar cells to form a module. This facility comprises production apparatuses for the following steps: providing the carriers, pre-assembling the solar cells by attaching contact wires, arranging transverse contact wires on the carrier, placing the pre-assembled solar cells on the carrier, longitudinally interconnecting the pre-assembled solar cells to the contact wires, transversely interconnecting the pre-assembled solar cells to the transverse contact wire, and assembling the solar cells located on the carrier to a carrier glass for manufacturing the module.

EP 0 111 394 A2 discloses a method, in which the solar cells are electrically connected prior to application to the bottom encapsulation layer. The conductive strips are welded to the exposed areas of the stainless-steel substrate in the process. In subsequent steps, the bottom and top encapsulation layers are applied to the modules.

DE 34 23 172 C2 discloses a method for manufacturing a solar panel. Electrical conductors project into the intermediate space between the solar cells, however, the electrical conductors are associated with the substrate films. By pressing on pressure plates made of quartz glass, the electrodes are brought into pressure contact with the solder layers on the conductors of the films in a sandwich-like manner. Laser beams supplied via fiber optic cables cause a melting of the solder layers. The electrodes for the top side and the bottom side of the solar cell are initially simultaneously applied and then simultaneously contacted.

Underlying Object

The object is now to provide a low-cost, fast method and a corresponding apparatus for automated manufacture of flexible solar cell strings largely independent of the dimensions in order to be able to integrate a solar module strand with at least one of these flexible solar cell strings.

Suggested Solution

For forming a flexible solar module strand, a method is suggested, which can comprise the following steps:
  providing a first conveyor track for applying flexible solar cells;
  guiding the first conveyor track in a closed track loop around two or more deflecting means;
  providing individual flexible solar cells, each comprising a photovoltaically active layer structure with a first side and a second side;
  applying the individual solar cells to the first conveyor track in such a manner that the individual solar cells are oriented, with their respective first sides and second sides, towards the first conveyor track in a predetermined orientation;
  retaining the solar cells at the outer face of the first conveyor track during assembly thereof to form at least one solar cell strip by applying further solar cells;
  deflecting the first conveyor track together with the at least one solar cell strip by guiding the first conveyor track over a first one of the deflecting means;
  separating the first conveyor track from the at least one deflected solar cell strip in such a manner that the solar cells are released, with their respective first or second sides facing the first conveyor track, from the first conveyor track; and
  applying the at least one deflected solar cell strip to a first film web in such a manner that the solar cells are oriented, with their respective first or second sides separated from the first conveyor track, away from the first film web.

The solar cells, on their first sides, can each be implemented, at least in sections, as a first electrically conductive pole, and, on their second sides, can be implemented, at least in sections, as a second electrically conductive pole. However, the first and second poles can also be disposed on the same side of the solar cells.

During interconnection of the solar cells to form a solar module, when the different electrical poles are disposed on different sides of the solar cells, the bottom side of a cell is electrically connected in series with the top side of a further cell in each case. In addition, a plurality of such serial connections are usually connected in parallel to each other. In this way, the desired connection values of the solar module are accomplished. However, there are other variants for interconnecting the solar cells in series or in parallel. The at least partially electrically interconnected (in series or in parallel) solar cells without the front-side layer and the rear-side construction, and without the flexible one or two-sided elastic encapsulation are also referred to as solar cell strips or solar cell strings. The at least partial electrical interconnection of the solar cells also provides for mechanical cohesion of the solar cell strip.

The approach suggested herein enables a highly efficient production of the solar module strand, since virtually almost endless solar cell strings can be pre-assembled from the solar cells with this approach. These solar cell strings can then be enclosed between likewise endless film webs to form the solar module strand.

By means of this approach it is possible to automatically reverse flexible solar cell strings in a manner largely independent of the dimensions (also endless) and to integrate them into the solar module strand. In this way, solar modules can be provided which enable a cost-efficient production of solar current due to lower production costs and less maintenance as compared to previous solutions and improved durability of the completed solar modules as compared to previous solutions.

The method can provide the step that the solar cells are retained at the outer face of the first conveyor track during assembly thereof to form the at least one solar cell strip. This can be accomplished in various ways. The method can provide that the first conveyor track is electromagnetic or permanently magnetic at its outer face. The flexible solar cells can be provided, for example, with a metallic rear-side contact, for example, made of stainless steel or aluminum. For retaining the solar cells including the rear-side contact of stainless steel so that they can subsequently be electrically interconnected to form flexible solar cell strips, the first conveyor belt is preferably a magnetic belt. The magnetic belt can be formed of narrow individual strips or of a continuous magnetic belt over the full width of the solar cell strip(s).

Alternatively or in addition thereto, the first conveyor track can comprise a plurality of negative-pressure outlets at its outer face for retaining the solar cells. This is the case when the flexible solar cells cannot be retained magnetically. Then, the first conveyor belt may alternatively enable retaining the flexible solar cells by negative pressure.

Moreover, the method can provide that the at least one solar cell strip is retained, at least in the region of the first deflecting means, on the first conveyor track by an enclosure, for example, in form of a guiding surface, or by rollers.

Furthermore, in a variant, the method can provide the following steps:

providing a second conveyor track,
guiding the second conveyor track in a closed track loop at the outer face of the first conveyor track so that the first conveyor track, in one section, is located between the second conveyor track and at least the first deflecting means, and
guiding the first conveyor track and the second conveyor track, including an angle, away from the first deflecting means for separating the first conveyor track from the at least one deflected solar cell strip so that the at least one deflected solar cell strip is released from the first conveyor track by means of the second conveyor track.

In another variant, an additional second conveyor belt can be transported along over the full width between the flexible solar cells and the first (magnetic or negative-pressure) conveyor belt for the later releasing process of the solar cell strip(s). By means of this second belt, the completed solar cell strips can be released, due to the different angle, from the first (magnetic or negative-pressure) conveyor belt for further processing by guiding the two conveyor belts away from the first deflecting means.

The magnetic strips can be arranged in narrow strips in turns with the additional non-magnetic second conveyor belt over the entire width of the first conveyor belt. During the releasing process of the solar cell strip(s) from the first (magnetic or negative-pressure) conveyor belt, these additional web strips made, for example, of fabric web, can release the flexible solar cell strip(s) from the first (magnetic or negative-pressure) conveyor belt.

A further variant of the method can provide the following steps:

providing a separating device, for example, in form of a deflection, wedge, or blowing nozzle in the region of the first deflecting means for separating the first conveyor track from the at least one deflected solar cell strip; and releasing the at least one deflected solar cell strip by means of the deflection, wedge, or blowing nozzle from the first conveyor track. This applies when the conveyor track is, for example, porous and thus not suitable for negative pressure. Then, in a further alternative, releasing and reversing of the solar cell strip(s) can be achieved by a deflection, wedge, or blowing nozzle in specific sections of the transport (for example, in the region of the first deflecting means).

In a further variant of the method, the flexible solar cell strip(s) can be electrically interconnected to each other prior to releasing them from the first conveyor belt. In particular, by electrically interconnecting a plurality of flexible solar cell strips located side by side on the first conveyor belt prior to releasing them from the first conveyor belt, mechanical cohesion of the flexible solar cell strip(s) is increased and the precise positioning thereof on the first film web is facilitated after reversing and releasing them from the first conveyor belt.

Between a solar cell including its electrical interconnection and the transparent front-side layer, or the solar cell including its electrical interconnection and/or its rear-side construction, a flexible, elastic, one or two-sided encapsulation made of a strip or web-like material or a film can optionally also be provided.

A further variant of the method can comprise the step of:
applying further electrical connections to the first film web and/or the first encapsulation of the solar cell strips made of a strip or web-like material or a second film web. This allows the subsequent further interconnection of the solar cell strips when assembling the same to the first film web and/or the first encapsulation.

In case a method variant is desired, in which the first encapsulation of the solar cell strips is provided, the method can provide the step of:

applying the first encapsulation of the solar cell strips to the first film web prior to applying the at least one deflected solar cell strip to the first film web.

In a further method variant, after separating the at least one deflected solar cell strip from the first conveyor track, the at least one deflected solar cell strip can be applied and fixed to the first film web and/or the first encapsulation of the solar cell strips by means of a pressure element.

The fixing of the at least one deflected solar cell strip to the first film web and/or the first encapsulation of the solar cell strips can be implemented by means of radiant-heat input into the first film web and/or the first encapsulation shortly prior to applying the at least one deflected solar cell strip. Alternatively, a double-sided adhesive tape, adhesive or adhesive conductive paste can be used for this purpose.

Furthermore, in a variant of the method, the first film web and/or the first encapsulation of the solar cell strips can comprise a rear-side film having barrier properties and an encapsulation film fixed thereon.

In one variant of the method, when applying the solar cells, the solar cells can in each case be applied, with their first sides facing the first conveyor belt, to the second side of an adjacent solar cell facing away from the first conveyor belt in a manner at least sectionally overlapping each other. Alternatively, the solar cells can be applied, with their first sides facing the first conveyor belt, to the first conveyor belt or the second conveyor belt in a manner not contacting each other. Then, the solar cells are at least partially electrically interconnected to form the at least one solar cell strip.

The at least partial electrical interconnection can be implemented prior to separating the at least one deflected solar cell strip from the first conveyor track using a conductive web material, a metal-strip material, a conductive paste, an electrical conductor made of a conductive web material, metal-strip material, grid material or wire material.

The first film web and/or the first encapsulation of the solar cell strips can comprise a rear-side film having barrier properties and an encapsulation film fixed thereon.

The first film web and/or the first encapsulation of the solar cell strips can be provided with interconnecting elements for the flexible solar cell strips prior to applying and fixing the flexible solar cell strips. Thus, the at least partial electrical interconnection of the solar cells implemented prior to deflecting the first conveyor track with the at least one solar cell strip can be completed to form at least one solar cell strip so that the solar module strand is completely electrically interconnected.

A first electrode is located on the rear side of the solar cell; usually, the positive pole is located on the (bottom) side of the solar cell facing away from the light energy source, and a second electrode is located on the top side; usually, the negative pole is located on the (top) side of the solar cell facing the light energy source.

When, for example, the first (bottom-side) electrically conductive pole of the solar cell is made of stainless steel film or aluminum film, a contact point can be formed in a low-ohmic or mechanically stable manner by means of a corresponding contact adhesive. A top-side contact of an adjacent cell is then connected by means of electrical conductors, such as for example a number of copper or aluminum conductors. The electrical conductor can be a wire with or without insulating sheath, an electrical strip line with or without insulating sheath, an electrically conductive grid, an elongate conductor, a loop, meander, spiral or zigzag-shaped electrical conductor. This conductor can then be guided in an S or Z-shape from the bottom-side electrically conductive pole of each solar cell to the top-side electrically conductive pole of the respective adjacent cell.

Assembly of the at least one solar cell strip including its at least partial electrical interconnection, the first film web and/or the first encapsulation can be carried out on a conveyor element adapted to move relative to the at least one solar cell strip located at a transfer position longitudinally to the direction of movement of the first or second conveyor belts for applying and fixing the at least one solar cell strip to or on the first film web and/or the first encapsulation.

Furthermore, it is possible to provide for detecting the relative position of the first film web and/or the first encapsulation, as well as of a partial electrical interconnection located thereon relative to the position of the partially interconnected at least one solar cell strip or the solar cells, and influencing the position of the at least one solar cell strip or the solar cells in the direction of conveyance of the first conveyor belt, or the position of the first film web and/or the first encapsulation.

This allows a precise positioning of the at least one flexible solar cell strip on the first film web and/or the first encapsulation and, in particular, of the partial wire connection located thereon. For this purpose, camera systems can be employed, wherein the images detected thereby are evaluated in a corresponding control unit in order to influence the depositing speed or depositing position of the solar cells, or the conveying speed of the solar cell strip. In a method variant, the cameras can acquire the position of the depositing area of the at least one flexible solar cell strip prior to application thereof to the first film web and/or the first encapsulation.

Thus, when assembling the at least one flexible solar cell strip from the individual solar cells, the flexible solar cells can then take the acquired position of the depositing areas into account and can be deposited on the first or second conveyor belts in a correspondingly pre-positioned manner to form the at least one flexible solar cell strip.

The at least one solar cell strip including its completed electrical interconnection on the first film web and/or the first encapsulation can be covered with a second film web and/or a second encapsulation.

The electrical interconnection on the top side and/or bottom side of the solar cells in terms of the cross-section of the electrical conductors and/or their longitudinal extension can at least partially be embedded into the second film web and/or the second encapsulation.

Instead of the second film web and/or the second encapsulation, for example, a thermoplastic adhesive mass intermittently enveloping the electrical conductor in parts can be applied to the electrical conductor of the electrical interconnection prior to or when dispensing the same onto or beneath the solar cells.

The electrical connection of the contact points of the solar cells to the electrical conductors can, in turn, be implemented using contact adhesives or by laser welding, welding, soldering or other connection technologies.

In preparation of this contacting/lamination step, the electrical conductors can already be fixed to the encapsulation material in pre-process step by the effect of pressure and temperature for a specific period of time, preferably in a roller-to-roller process. In this connection, the electrical conductor can be partially sunk or embedded into the encapsulation material/the second film web made of EVA, TPU, etc.

One alternative thereto can be to heat the electrical conductor and then partially embed or sink the electrical conductor into the flexible second film web and/or the second encapsulation. Alternatively or in addition thereto, the flexible second film web and/or the second encapsulation, for example a thermoplastic film web or a film roughly corresponding to the shape of the electrical conductor in its longitudinal extension and having a corresponding projecting edge, can be heated and thus softened for partially embedding or sinking the electrical conductor into the flexible second film web and/or the second encapsulation.

This intermediate product consisting of the second film web and/or the second encapsulation including the electrical conductor of the electrical interconnection yet to be implemented on the least one solar cell strip can then be provided as "continuous material" on roll or as portioned surface or strip material in order to be applied to each one of the solar cell strips for forming the solar module strand.

The method described herein can also be applied to rigid solar cells.

The first and/or second film web can preferably be a weather-resistant flexible film covered with a self-adhesive layer. Alternatively thereto, the first and/or second film web can also be a weather-resistant film covered with a thermoplastic layer. Then, the connection between the first/second film web or the first and/or second encapsulation and the flexible solar cells can be accomplished by heat input.

When transferring the flexible solar cells to the first conveyor belt, a plurality of flexible solar cells can be disposed in a direction longitudinal and/or transverse to the direction of conveyance of the first film web. Thus, the desired configuration of serial and/or parallel interconnection of the individual flexible solar cells to form a cell field defining the solar module strand, i.e. the solar module string, can be determined in a highly flexible manner.

The electrically conductive contact strips can be applied to the flexible solar cells in a direction longitudinal to the direction of conveyance of the first film web from a plurality of adjacent dispensers, which are arranged substantially in a direction longitudinal to the direction of conveyance of the first film web, containing rolls of conductive contact strips, or dispensers containing electrically conductive paste. Alternatively or in addition thereto, the electrically conductive contact strips can be applied to the flexible solar cells in a direction transverse to the direction of conveyance of the first film web from at least one dispenser, which is arranged substantially in a direction transverse to the direction of conveyance of the first film web, containing a roll of conductive contact strips, or a dispenser containing electrically conductive paste. Thus, it is possible to electrically interconnect the flexible solar cells in series and/or in parallel in a highly variable and efficient manner.

The individual flexible solar cells can also be provided as separate segments in a container. Analogously thereto, flexible solar cells can be provided in a stacking area. The stacking area can comprise a removable container, in which the flexible solar cells are provided.

The second film web can be laminated onto the first film web and the flexible solar cells by a roller laminator. The roller laminator comprises at least two counter-rotating rollers rotating at a defined speed and pressing the solar-cell/film-web composite together at a defined pressure and at a defined temperature. This allows the manufacture of high-quality solar modules.

A solar module strand formed of the first and second film webs and the first and second encapsulations, if any, and the intermediate flexible solar cells can be wound up to form a roll.

A thermoplastic polyurethane film or another weather-resistant (rear-side) film can be used as the first and/or second film webs.

Pressing the first film web and the first encapsulation, if any, to the flexible solar cell strand, and pressing the second film web and the second encapsulation, if any, can be effected by means of a roller press having at least one roller and a counter bearing, or two counter-rotating rollers rotating at a defined speed and pressing a composite of the film webs, the encapsulations, if any, and the flexible solar cell strand together at a defined pressure and at a defined temperature.

Accordingly, an apparatus for manufacturing a solar module according to the independent apparatus claim can comprise the following assemblies or components:
two or more deflecting means, around which an endless first conveyor track is guided and driven in a closed track loop, and between which an at least roughly planar application and Interconnection area is formed on the first conveyor track;
a dispensing means for applying flexible solar cells, each comprising a photovoltaically active layer structure with a first side and a second side, onto the application and interconnection area of the first conveyor track in such a manner that the solar cells are oriented, with their respective first sides and second sides, towards the first conveyor track in a predetermined orientation;
a device for retaining the solar cells at the outer face of the first conveyor track during assembly thereof cells to form at least one solar cell strip by applying further solar; wherein
the first conveyor track is guided around one of the deflecting means in such a manner that the at least one solar cell strip is transported to an application site for successively applying the solar cells of the at least one solar cell strip, with their sides oriented away from the first conveyor track, to a first film web transported to the application site;
a separating device for separating the first conveyor track from the at least one deflected solar cell strip between the one of the deflecting means and the application site in such a manner that the solar cells are released, with their respective sides facing the first conveyor track, from the first conveyor track.

The apparatus can comprise a first interconnecting device for the solar cells at the outer face of the first conveyor track, wherein the retaining means retains the solar cells during assembly thereof to form the at least one solar cell strip.

The first conveyor track can comprise solenoids or permanent magnets acting towards its outer face, or a plurality of negative-pressure outlets adapted for retaining the solar cells on the first conveyor track.

At least in the region of the first deflecting means of the at least one solar cell strip, an enclosure for retaining the solar cell strips on the first conveyor track can be provided.

A second conveyor track guided in a closed track loop at an outer face of the first conveyor track can be located between the first conveyor track and at least the one first deflecting means. This second conveyor track can be adapted and arranged for separating the first conveyor track from the at least one deflected solar cell strip from the one first deflecting means, including an angle, in order to release the at least one deflected solar cell strip from the first conveyor track by the second conveyor track and transport it to the application site.

Instead of the second conveyor track, a deflection, wedge, or blowing nozzle can be arranged in the region of the first deflecting means for separating the first conveyor track from the at least one deflected solar cell strip.

The first interconnecting device can serve the purpose of at least partially electrically interconnecting a plurality of flexible solar cell strips located side by side on the first conveyor belt prior to releasing the flexible solar cell strips located on the first conveyor belt from the first conveyor belt.

A second interconnecting device can be provided for at least partially applying further electrical connections to the first film web and/or a first encapsulation of the solar cell strips made of a strip or web-shaped material or a second film web.

Furthermore, a device for applying the first encapsulation of the solar cell strips to the first film web prior to applying the at least one deflected solar cell strip to the first film web and the first encapsulation can be provided.

A pressure element or pressure device can be provided and serve the purpose of applying and fixing the at least one deflected solar cell strip to the first film web or the first encapsulation of the solar cell strips after separating the at least one deflected solar cell strip from the first conveyor track.

A radiant-heat source can be provided and serve the purpose of fixing the at least one deflected solar cell strip to the first film web and/or the first encapsulation of the solar cell strips by means of radiant-heat input into the first film web and/or the first encapsulation shortly prior to applying the at least one deflected solar cell strip. Alternatively thereto, a double-sided adhesive tape, adhesive or adhesive conductive paste can be dispensed from a corresponding dispenser.

A first conductor dispenser can be provided and serve the purpose of implementing the at least partial electrical interconnection prior to separating the at least one deflected solar cell strip from the first conveyor track using a conductive web material, a metal-strip material, a conductive paste, an electrical conductor made of a conductive web material, metal-strip material, grid material or wire material.

A second conductor dispenser can be provided and serve the purpose of providing the first film web and/or the first encapsulation of the solar cell strips with interconnecting elements for the flexible solar cell strips prior to applying and fixing the flexible solar cell strips.

A conveyor element for assembling the at least one solar cell strip including its at least partial electrical interconnection, the first film web and/or the first encapsulation can be provided, and adapted and driven in a controlled manner to move relative to the at least one solar cell strip located at a transfer position longitudinally to the direction of movement of the first or second conveyor belts for applying and fixing the at least one solar cell strip to or on the first film web and/or the first encapsulation.

A detector (e.g. sensor, camera etc.) for detecting the relative position of the first film web and/or the first encapsulation, as well as of a partial electrical interconnection located thereon relative to the position of the partially interconnected at least one solar cell strip or the solar cells can be provided, and serve the purpose of supplying signals to a control unit of the drive of the film web and/or the encapsulation for influencing the position of the at least one solar cell strip or the solar cells in the direction of convey- ance of the first conveyor belt, or the position of the first film web and/or the first encapsulation.

A device can be provided and adapted for covering the at least one solar cell strip including its completed electrical interconnection on the first film web and/or the first encapsulation with a second film web and/or a second encapsulation.

A device can be provided and adapted for at least partially embedding the electrical interconnection on the top side and/or bottom side of the solar cells in terms of the cross-section of the electrical conductors and/or their longitudinal extension into the second film web and/or the second encapsulation.

A dispenser can be provided and adapted for applying, for example, a thermoplastic adhesive mass intermittently enveloping the electrical conductor in parts to the electrical conductor of the electrical interconnection prior to or when dispensing the same onto or beneath the solar cells.

A transfer device can be provided and adapted for depositing the flexible solar cells onto the first conveyor belt in a direction longitudinal and/or transverse to the direction of conveyance of the first conveyor belt, preferably from both longitudinal sides of the first conveyor belt.

A roller laminator can be provided and adapted for laminating the first and second film webs and the first and second encapsulations, if any, and the intermediate flexible solar cells together, wherein the roller laminator comprises at least two counter-rotating rollers rotating at a defined speed and pressing the solar-cell/film-web composite together at a defined pressure and at a defined temperature.

BRIEF DESCRIPTION OF THE DRAWINGS

Further objects, features, advantages and possible applications are apparent from the following description of embodiments, which are not to be understood as limiting, with reference to the accompanying drawings. All described and/or graphically illustrated features by themselves or in any combination, also independent of their grouping in the claims or the dependencies thereof, form the subject matter disclosed herein. The dimensions and proportions of the components shown in the Figures are not necessarily to scale; they may deviate from what is illustrated here in embodiments to be implemented.

The above explained product, apparatus and method details are described in context. However, it is pointed out that they are independent of each other and can be freely combined in each case.

FIG. 1a illustrates, in schematic side view, an apparatus for removing individual solar cells or solar sub-modules from a container, for reversing this individual solar cell or solar sub-module, and for depositing it for assembly of a solar module strand.

FIG. 1b illustrates, in schematic side view, a variant of the apparatus of FIG. 1 for manufacturing a solar module strand.

FIG. 2 illustrates, in schematic side view, a schematic sectional view of a solar module strand which can be obtained by means of the apparatus illustrated in FIG. 1, wherein the individual layers of the solar module strand are shown separated from each other.

FIGS. 3-5 show variants of interconnections of the individual solar cells or solar sub-modules to form solar module strips and solar module strands, or solar modules.

DETAILED DESCRIPTION OF THE DRAWINGS

Figure 1:
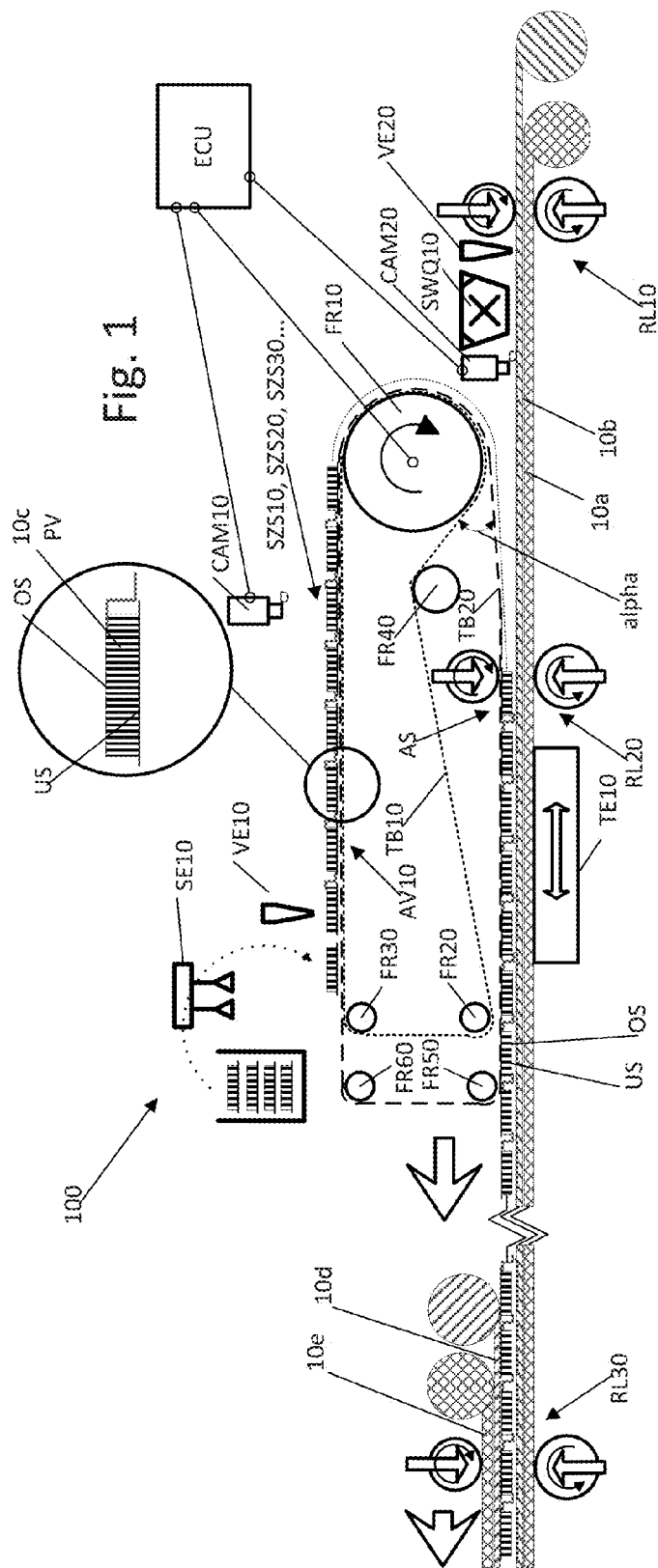
FIG. 1 illustrates, in schematic side view, an apparatus for manufacturing a solar module strand.

The basic sequence of the method suggested herein and the corresponding apparatus are explained on the basis of the Figures. A series of variants are possible which are not specifically illustrated in connection with the Figures, but are disclosed in the rest of the description.

The apparatus 100 for manufacturing a flexible solar module strand shown in FIG. 1 comprises four deflecting means in form of conveyor rollers FR10, FR20, FR30, FR40, around which an endless first conveyor track TB10 is guided in a closed track loop. One of the deflecting means is driven; here, it is conveyor roller FR10 which is rotated by a motor drive not illustrated in greater detail, wherein speed and start/stop of conveyor roller FR10 can be influenced by a control unit not illustrated in greater detail either. Between two of the conveyor rollers, i.e. the two conveyor rollers FR30 and FR10 in FIG. 1, an at least roughly planar application and interconnection area AV10 is formed on the top outer face of the first conveyor track TB10. In this embodiment shown in FIG. 1, the first conveyor track TB10 runs around conveyor rollers FR10, FR20, FR30, FR40 spanning a polygon in a clockwise direction.

At the end of the application and interconnection area AV10 on the left side of FIG. 1, a first dispensing device SE10 is located above the first conveyor track TB10 in order to apply flexible solar cells DSZ10, DSZ20 . . . to the application and interconnection area AS10 of the first conveyor track TB10. The solar cells DSZ10, DSZ20 . . . each comprise a photovoltaically active layer structure PV with a first side US and a second side OS. Application is implemented by means of the first dispensing device SE10 in such a manner that the solar cells DSZ10, DSZ20 . . . are oriented, with their respective first sides OS and second sides US, towards the first conveyor track TB10 in a predetermined orientation. In this embodiment shown in FIG. 1, the second side US is oriented towards the first conveyor track TB10 and the first side OS is oriented away from the first conveyor track TB10.

A first interconnecting device VE10 for at least partially electrically interconnecting the solar cells DSZ10, DSZ20 . . . applied to the first conveyor track TB10 is arranged in the application and interconnection area AV10 also above the first conveyor track TB10 downstream of the first dispensing device SE10 in the direction of conveyance F. By this at least partial electrical interconnection of the applied solar cells DSZ10, DSZ20 . . . , at least one continuous, endless solar cell strip SZS10, SZS20, SZS30 is formed. A number of endless solar cell strips SZS10, SZS20, SZS30 can be formed side by side on the first conveyor track TB10 in the direction of conveyance F. A solar cell strip comprises either one or a number of solar cells in a direction transverse to the direction of conveyance F and a great number of solar cells in the direction of conveyance F of the first conveyor track TB10. Variations of possible arrangements and interconnections of the solar cell strips are explained in detail further below. In the variant shown in FIG. 1, the first conductor dispenser is adapted for at least partially interconnecting the solar cell strip(s) to a conductive web material, a metal-strip material, a conductive paste, an electrical conductor made of a conductive web material, metal-strip material, grid material or wire material by applying connections and/or interconnection components (leads, protective diodes, etc.) onto or beneath the solar cells.

FIG. 1a shows the first dispensing device SE10 in form of a device for transferring the flexible solar cells DSZ10, DSZ20 . . . from a container B10 to the first conveyor track TB10 in a direction longitudinal and/or transverse to the direction of conveyance F of the first conveyor track TB10, preferably from both longitudinal sides of the first conveyor track TB10.

The flexible solar cells DSZ10, DSZ20 . . . can be delivered in the container B10 all in the same or in a different orientation of their first or second sides US, OS. A pivotable or rotatable lifter H10, here comprising one, or in another variant two, suction cup(s) each arranged on a pivot arm, is configured to be lowerable into the container B10 along the axis Y. Depending on the orientation of the solar cells DSZ10, DSZ20 . . . in the container B10 and the desired orientation of the solar cells DSZ10, DSZ20 . . . on the first conveyor track TB10, the lifter H10 is rotated about its axis of rotation so that the lifted out solar cells DSZ10, DSZ20 . . . are turned. In case the lifted out solar cells DSZ10, DSZ20 . . . are not required to be turned, the lifter H10 is moved in the XZ plane directly after lifting in order to then lower and deposit the solar cells DSZ10, DSZ20 . . . in the Y direction over the first conveyor track TB10. In case the lifted out solar cells DSZ10, DSZ20 . . . need to be turned, the lifter H10 is rotated by 180° directly after lifting so that the lifted out solar cells DSZ10, DSZ20 . . . are turned in their orientation. In this position and orientation, they are then transferred to a second lifter H20, which can be moved in the XZ plane and can be lifted and lowered in the Y direction. This second lifter H20 is moved in the XZ plane directly after transfer of the solar cells DSZ10, DSZ20 . . . in order to then lower and deposit the solar cells DSZ10, DSZ20 . . . over the first conveyor track TB10.

The first conveyor track TB10 is guided around one of the deflecting means, i.e. the conveyor roller FR10 in the variant illustrated in FIG. 1, at the other end of the application and interconnection area AV10. The first conveyor track TB10 is put into circulation around conveyor rollers FR10 . . . FR40 by conveyor roller FR10. In the variant illustrated in FIG. 1, the first conveyor track TB10 contacts conveyor roller FR10 at an angle of contact of approx. 180°. However, smaller or greater angles of contact are possible as well. What is decisive is that the angle of contact is chosen such that the solar cell strip(s) SZS10, SZS20, SZS30 located on the first conveyor track TB10 is/are transported to an application site AS and reversed in the process. The solar cells DSZ10, DSZ20 . . . of the solar cell strip(s) SZS10, SZS20, SZS30 are successively applied, with their sides oriented away from the first conveyor track TB10, i.e. the second side OS in FIG. 1, to a first film web 10a transported to the application site AS.

By transporting the solar cell strip(s) SZS10, SZS20, SZS30 out of the application and interconnection area AV10 around the conveyor roller FR10—corresponding to the angle of contact—it/they is/are reversed. For example, after reversing the solar cells DSZ10, DSZ20 . . . forming the solar cell strip SZS10, SZS20, SZS30, their second sides OS are on bottom and their first sides US are on top, while the solar cells DSZ10, DSZ20 . . . are placed on the first conveyor track TB10 in such a manner that their second sides OS are on top and their first sides US are on bottom.

The apparatus 100 illustrated in FIG. 1 comprises a separating device for separating the first conveyor track TB10 from the at least one deflected solar cell strip SZS10, SZS20, SZS30 between the conveyor roller FR10 and the application site AS. This serves the purpose of releasing the solar cells DSZ10, DSZ20 . . . , with their respective sides facing the first conveyor track TB10, from the first conveyor track TB10.

For fixing the position of the solar cells DSZ10, DSZ20 . . . at the outer face of the first conveyor track TB10 and for preventing the solar cells DSZ10, DSZ20 . . . from coming or falling off the first conveyor track TB10 during turning around the conveyor roller FR10, a retaining device is provided. This retaining device may take various forms; its task is to retain the solar cells while they are assembled to form the at least one solar cell strip SZS10, SZS20, SZS30 . . . and then successively transported around the conveyor roller FR10 and reversed in the process. The diameter of the conveyor roller FR10 in relation to the dimension (length or width) of solar cells bent by the conveyor roller FR10 should be as large as possible so that they and the already applied interconnections are mechanically stressed as little as possible by the deflection around the conveyor roller FR10.

In the variant shown in FIG. 1, the first conveyor track TB10 comprises permanent magnets acting towards its outer face which are adapted for retaining the solar cells DSZ10, DSZ20 . . . on the conveyor track TB10. This is, especially in the case of solar cells DSZ10, DSZ20 . . . having a ferromagnetic metal layer on the side facing the first conveyor track TB10, a highly efficient variant.

For releasing the solar cells DSZ10, DSZ20 . . . having a ferromagnetic metal layer from the first conveyor track TB10 in a manner as stress-free as possible for the solar cells DSZ10, DSZ20 . . . , a second conveyor track TB20 is provided which is guided in a closed track loop at an outer face of the first conveyor track TB10. In the variant shown in FIG. 1, this first conveyor track TB10 is located between the second conveyor track TB20 and the first deflecting means FR10. Apart from that, it is guided around the further deflecting means FR50, FR60 and serves the purpose of separating the first conveyor track TB10 and the deflected solar cell strip(s) SZS10, SZS20, SZS30 from the first deflecting means FR10 including an angle alpha. This causes the deflected solar cell strip(s) SZS10, SZS20, SZS30 to be released from the first conveyor track TB10 by means of the second conveyor track TB20 and be transported to the application site AS. The angle alpha is preferably an acute angle (<90°). The deflected solar cell strip(s) SZS10, SZS20, SZS30 is/are applied to the first film web 10a in the region of the application site AS. The arrangement is such that the deflected solar cell strip(s) SZS10, SZS20, SZS30 preferably hit the first film web 10a at an acute angle of approx. <300 (e.g. 5° to 10°) in the region of the application site AS.

Before the first film web 10a reaches the application site AS, it passes a second interconnecting device VE20, by which connections and/or interconnection components (leads, protective diodes, etc.) still missing on the solar cell strip(s) SZS10, SZS20, SZS30 are applied to the first film web 10a. In the variant shown in FIG. 1, an optional first encapsulation 10b for the solar cell strip(s) SZS10, SZS20, SZS30 made of a strip or web-like material or a second film web is further inserted between the first film web 10a and the solar cell strip(s) SZS10, SZS20, SZS30. In this case, the connections and/or interconnection components W are applied to this first encapsulation 10b by the second interconnecting device VE20. If this first encapsulation 10b is provided, the composite of first encapsulation 10b and first film web 10a (as well as connections and/or interconnection components W) is joined by a first roller laminator RL10 prior to or after application of the connections and/or interconnection components W to this first encapsulation 10b by the second interconnecting device VE20. This first roller laminator RL10 is used for applying and fixing the first encapsulation 10b to the first film web 10a prior to applying the deflected solar cell strip(s) SZS10, SZS20, SZS30 to the first film web 10a and the first encapsulation 10b.

Before this laminated composite of first film web 10a, first encapsulation 10b and connections and/or interconnection components W reaches the application site AS, it passes a radiant-heat source SWQ10. This facilitates the joining and fixing of the deflected solar cell strip(s) SZS10, SZS20, SZS30 to the first film web 10a and/or the first encapsulation 10b. For this purpose, the first film web 10a and/or the first encapsulation 10b is softened by radiant-heat input shortly prior to application of the solar cell strip(s) SZS10, SZS20, SZS30. Instead of the radiant-heat source SWQ10, a double-sided adhesive tape, adhesive or adhesive conductive paste can be dispensed from a corresponding dispenser for joining and fixing the deflected solar cell strip(s) SZS10, SZS20, SZS30 to the first film web 10a and/or first encapsulation 10b.

A pressure device in form of a second roller laminator RL20 is located in the region of the application site AS. This second roller laminator RL20 serves the purpose of applying and fixing the solar cell strip to the first film web 10a or the first encapsulation 10b, if any, of the solar cell strips SZS10, SZS20, SZS30 after separating the solar cell strip from the first conveyor track TB10.

A conveyor element TE10 in form of a supporting table or belt conveyor can also be located in the region of the application site AS for joining the solar cell strip(s) to the composite of electrical interconnection, first film web 10a and first encapsulation 10b. The conveyor element is adapted and driven in a controlled manner to move relative to the at least one solar cell strip SZS10, SZS20, SZS30 located at a transfer position longitudinally to the direction of movement of the first or second conveyor belt for applying and fixing the solar cell strip(s) to or on the first film web 10a and/or the first encapsulation 10b. For controlling and accomplishing this, a detector including a first camera CAM10 for detecting the relative position of the first film web 10a and/or the first encapsulation 10b, as well as of an electrical interconnection W located thereon, and a second camera CAM20 for detecting the relative position of the solar cell strip(s) SZS10, SZS20, SZS30 or the solar cells DSZ10, DSZ20 . . . is provided. These two cameras CAM10, CAM20 provide respective signals for influencing the position of the at least one solar cell strip SZS10, SZS20, SZS30 or the solar cells DSZ10, DSZ20 . . . in the direction of conveyance F of the first conveyor belt, or the position of the first film web 10a and/or the first encapsulation 10b to an ECU controlling the speed of the first deflecting means FR10 and the depositing of the solar cells DSZ10, DSZ20 onto the first conveyor belt TB10.

After the composite of first film web 10a, first encapsulation 10b and connections and/or interconnection components W, as well as solar cell strips SZS10, SZS20, SZS30 has passed the application site AS on the conveyor element TE10, the composite arrives at a device for covering the solar cell strip(s) SZS10, SZS20, SZS30 including its completed electrical interconnection with a second film web 10e and/or a second encapsulation 10d. In the variant illustrated here, this device for covering is a third roller laminator RL30. For improving cohesion, a not-shown radiant-heat source or adhesive application station can be arranged upstream of this roller laminator RL30. After passing this third roller laminator RL30, the virtually endless solar module strand is finished and has the structure shown in FIG. 2, wherein the first film web 10a forms the side facing the sun.

This third roller laminator RL30, just as the first and second roller laminators RL30, can comprise at least two counter-rotating rollers (or narrow rolls) rotating at a defined speed and pressing the respective material composite together at a defined pressure and at a defined temperature.

A variant of the apparatus shown in FIG. 1 is illustrated in FIG. 1b. Here, instead of the first and second film webs 10a, 10e or the first and second encapsulations 10b, 10d supplied in an endless manner, segments of first and second film webs 10a, 10e or first and second encapsulations 10b, 10d are supplied to the application site piece by piece in form of layered material or web material on a support TE10 movable longitudinally to the direction of conveyance. As for the rest, there is no further difference to the structure of the apparatus or the sequence of the method. Merely the counter-rotating rollers of the three roller laminators RL10, RL20 and RL30 can be replaced by rollers/rolls provided on one side of the material composite only, said rollers/rolls pressing the material composite against the support TE10 at a defined pressure and at a defined temperature.

In FIG. 3, a variant of three solar cell strands producible by the present apparatus and applied side by side in parallel to the first conveyor track TB10 is shown. Solar cells are used, in which both poles, i.e. both the positive pole and the negative pole thereof, are formed on one side, in this case the top side of the solar cells. In this interconnection variant, the sequence of the individual method steps is apparently chosen such that the first interconnecting device VE10 applies the interconnection segments oriented longitudinally to the direction of conveyance of the first conveyor track TB10 to the solar cells/the first conveyor track TB10, and the second interconnecting device VE20 applies the interconnection segments oriented transversely to the direction of conveyance of the first conveyor track TB10.

FIG. 4 illustrates a variant of a solar module strand producible by the present apparatus, in which the individual solar cells are imbricated on top of each other. Solar cells are used, in which the two poles, i.e. the positive pole and the negative pole thereof, are formed on different sides of the solar cells. The first interconnecting device VE10 provides the conductive adhesive paste required for connecting the different poles of interconnected solar cells. The residual interconnection for series/parallel connection, which is not illustrated in further detail here, can be implemented by the second interconnecting device VE20.

In FIG. 5, a variant of two solar cell strands producible by the present apparatus and applied side by side in parallel to each other to the first conveyor track TB10 is illustrated. Solar cells are used, in which the two poles, i.e. the positive pole and the negative pole thereof, are formed on different sides of the solar cells. In this interconnection variant, the sequence of the individual method steps is apparently chosen such that the first interconnecting device VE10 applies the S-shaped interconnection segments oriented longitudinally to the direction of conveyance of the first conveyor track TB10 onto and below the solar cells/the first conveyor track TB10. The first conveyor track TB10 is moved back and forth in a stepwise manner in order to place the interconnection also below the bottom sides of the solar cells. The second interconnecting device VE10 provides the interconnection segments oriented transversely to the direction of conveyance of the first conveyor track TB10.

It is to be understood that the interconnection of the individual solar cells to form solar cell strands, and the interconnection of the solar cell strands to form solar modules or solar module strands can be implemented in a great number of different variants owing to the desired dimensions and electrical connection values.

The invention claimed is:

1. A method for forming a flexible solar module strand, comprising the steps of:

providing a first conveyor track for applying flexible solar cells;

guiding the first conveyor track in a closed track loop around two or more deflecting means;

providing the flexible solar cells, each comprising a photovoltaically active layer structure (PV) with a first side (US) and a second side;

applying the solar cells to the first conveyor track in such a manner that the solar cells are oriented, with their respective first sides and second sides, towards the first conveyor track in a predetermined orientation;

retaining the solar cells at the outer face of the first conveyor track during assembly thereof to form at least one solar cell strip by applying further solar cells;

deflecting the first conveyor track together with the at least one solar cell strip by guiding the first conveyor track over a first one of the deflecting means;

separating the first conveyor track from the at least one deflected solar cell strip in such a manner that the solar cells of the respective solar cell strip are released, with their respective first or second sides facing the first conveyor track, from the first conveyor track; and applying the at least one deflected solar cell strip to a first film web in such a manner that the solar cells of the respective solar cell strip are oriented, with their respective first or second sides separated from the first conveyor track, away from the first film web.

2. The method for forming a flexible solar module strand according to claim 1, wherein the solar cells, on their first sides, are each implemented, at least in sections, as a first electrically conductive pole, and, on their second sides, are each implemented, at least in sections, as a second electrically conductive pole, or wherein the first and second poles are disposed on the same side of the solar cells.

3. The method for forming a flexible solar module strand according to claim 1, comprising the step of:

at least partially electrically interconnecting the solar cells applied to the first conveyor track to form the at least one solar cell strip prior to deflecting the first conveyor track together with the at least one solar cell strip over the first one of the deflecting means.

4. The method for forming a flexible solar module strand according to claim 1, wherein the first conveyor track is electromagnetic or permanently magnetic at its outer face, or comprises a plurality of negative-pressure outlets for retaining the solar cells.

5. The method for forming a flexible solar module strand according to claim 1, comprising the step of:

retaining the at least one solar cell strip, at least in the region of the first deflecting means, on the first conveyor track by an enclosure of the solar cell strip.

6. The method for forming a flexible solar module strand according to claim 1, comprising the steps of:

providing a second conveyor track;

guiding the second conveyor track in a closed track loop at the outer face of the first conveyor track so that the first conveyor track is located between the second conveyor track and at least the first deflecting means, and guiding the first conveyor track and the second conveyor track, including an angle, away from the first deflecting means for separating the first conveyor track from the at least one deflected solar cell strip so that the at least one deflected solar cell strip is released from the first conveyor track by means of the second conveyor track.

7. The method for forming a flexible solar module strand according to claim 1, comprising the steps of:

providing a deflection, wedge, or blowing nozzle in the region of the first deflecting means for separating the first conveyor track from the at least one deflected solar cell strip; and releasing the at least one deflected solar cell strip by means of the deflection, wedge, or blowing nozzle from the first conveyor track.

8. The method for forming a flexible solar module strand according to claim 1, comprising the step of:

electrically interconnecting a plurality of the flexible solar cell strips located side by side on the first conveyor belt prior to or after releasing them from the first conveyor belt.

9. The method for forming a flexible solar module strand according to claim 1, comprising the step of:

applying further electrical connections to the first film web and/or a first encapsulation of the solar cell strips made of a strip or web-like material or a second film web.

10. The method for forming a flexible solar module strand according to claim 1, comprising the step of:

applying the first encapsulation of the solar cell strips to the first film web prior to applying the at least one deflected solar cell strip to the first film web.

11. The method for forming a flexible solar module strand according to claim 1, wherein, after separating the at least one deflected solar cell strip from the first conveyor track, the at least one deflected solar cell strip is applied and fixed to the first film web and/or the first encapsulation of the solar cell strips by means of a pressure element.

12. The method for forming a flexible solar module strand according to claim 1, wherein the fixing of the at least one deflected solar cell strip to the first film web and/or the first encapsulation of the solar cell strips is implemented by means of radiant-heat input into the first film web and/or the first encapsulation shortly prior to applying the at least one deflected solar cell strip, or by using a double-sided adhesive tape, adhesive or adhesive conductive paste.

13. The method for forming a flexible solar module strand according to claim 1, wherein the first film web and/or the first encapsulation of the solar cell strips can comprise a rear-side film having barrier properties and an encapsulation film fixed thereon.

14. The method for forming a flexible solar module strand according to claim 1, wherein, when applying the solar cells, the solar cells are in each case applied either, with their first sides facing the first conveyor belt, to the second side of an adjacent solar cell facing away from the first conveyor belt in a manner at least sectionally overlapping each other, or the solar cells are applied, with their first sides facing the first conveyor belt, to the first conveyor belt or the second conveyor belt in a manner not contacting each other, and are then at least partially electrically interconnected to form the at least one solar cell strip.

15. The method for forming a flexible solar module strand according to claim 1, wherein the at least partial electrical interconnection is implemented prior to separating the at least one deflected solar cell strip from the first conveyor track using a conductive web material, a metal-strip material, a conductive paste, an electrical conductor made of a conductive web material, metal-strip material, grid material or wire material.

16. The method for forming a flexible solar module strand according to claim 1, wherein the first film web and/or the first encapsulation of the solar cell strips can comprise a rear-side film having barrier properties and an encapsulation film fixed thereon.

17. The method for forming a flexible solar module strand according to claim 1, wherein the first film web and/or the first encapsulation of the solar cell strips are provided with interconnecting elements for the flexible solar cell strips prior to applying and fixing the flexible solar cell strips.

18. The method for forming a flexible solar module strand according to claim 1, wherein the first bottom-side electrically conductive pole of each of the solar cells comprises a stainless steel film or aluminum film, and a top-side contact of an adjacent solar cell is connected by means of at least one electrical conductor, wherein this at least one electrical conductor can comprise a number of copper or aluminum conductors, and is a wire with or without insulating sheath, an electrical strip line with or without insulating sheath, an electrically conductive grid, an elongate conductor, a loop, meander, spiral or zigzag-shaped electrical conductor, and is guided in an S or Z-shape from the bottom-side electrically conductive pole of the respective solar cell to the top-side electrically conductive pole of the respective adjacent solar cells.

19. The method for forming a flexible solar module strand according to claim 1, comprising the step of:

assembling the at least one solar cell strip including its at least partial electrical interconnection, the first film web and/or the first encapsulation on a conveyor element adapted to move relative to the at least one solar cell strip located at a transfer position longitudinally to the direction of movement of the first or second conveyor belts for applying and fixing the at least one solar cell strip to or on the first film web and/or the first encapsulation.

20. The method for forming a flexible solar module strand according to claim 1, comprising the steps of:

detecting the relative position of the first film web and/or the first encapsulation, as well as of a partial electrical interconnection located thereon relative to the position of the partially interconnected at least one solar cell strip or the solar cells, and influencing the position of the at least one solar cell strip or the solar cells in the direction of conveyance of the first conveyor belt, or the position of the first film web and/or the first encapsulation.

21. The method for forming a flexible solar module strand according to claim 1, comprising the step of:

covering the at least one solar cell strip including its completed electrical interconnection on the first film web and/or the first encapsulation with a second film web and/or a second encapsulation.

22. The method for forming a flexible solar module strand according to claim 1, comprising the step of:

at least partially embedding the electrical interconnection on the top side and/or bottom side of the solar cells in terms of the cross-section of the electrical conductors and/or their longitudinal extension into the second film web and/or the second encapsulation.

23. The method for forming a flexible solar module strand according to claim 1, wherein, instead of the second film web and/or the second encapsulation, for example, a thermoplastic adhesive mass intermittently enveloping the electrical conductor in parts is applied to the electrical conductor of the electrical interconnection prior to or when dispensing the same onto or beneath the solar cells.

24. The method for forming a flexible solar module strand according to claim 1, wherein the electrical connection of the contact points of the solar cells to the electrical conductors is implemented using contact adhesives or by laser welding, welding, soldering or other connection technologies.

25. The method for forming a flexible solar module strand according to claim 1, wherein the electrical conductors are fixed to the encapsulation material in pre-process step by the effect of pressure and temperature for a specific period of time.

26. The method for forming a flexible solar module strand according to claim 1, wherein the electrical conductor is heated and then partially embedded or sunk into the flexible second film web and/or the second encapsulation, or the flexible second film web and/or the second encapsulation is heated and thus softened for partially embedding or sinking the electrical conductor into the flexible second film web and/or the second encapsulation.

27. The method for forming a flexible solar module strand according to claim 1, wherein a weather-resistant flexible film covered with a self-adhesive layer is used as a material for the first and/or second film web, or a weather-resistant flexible film covered with a thermoplastic layer is used as a material for the first and/or second film web.

28. The method for forming a flexible solar module strand according to claim 1, wherein, when transferring the flexible solar cells to the first conveyor belt, a plurality of flexible solar cells are disposed in a direction longitudinal and/or transverse to the direction of conveyance of the first film web, preferably from both longitudinal sides of the first film web.

29. The method for forming a flexible solar module strand according to claim 1, wherein the electrically conductive contact strips are applied to the flexible solar cells in a direction longitudinal to the direction of conveyance of the first film web from a plurality of adjacent dispensers, which are arranged substantially in a direction longitudinal to the direction of conveyance of the first film web, containing rolls of conductive contact strips, or dispensers containing electrically conductive paste, or the electrically conductive contact strips can be applied to the flexible solar cells in a direction transverse to the direction of conveyance of the first film web from at least one dispenser, which is arranged substantially in a direction transverse to the direction of conveyance of the first film web, containing a roll of conductive contact strips, or a dispenser containing electrically conductive paste.

30. The method for forming a flexible solar module strand according to claim 1, wherein the individual flexible solar cells are provided as separate segments in a container, or are provided in a stacking area.

31. The method for forming a flexible solar module strand according to claim 1, wherein the first and the second film webs and the first and second encapsulations, if any, and the intermediate flexible solar cells are laminated together by a roller laminator, wherein the roller laminator comprises at least two counter-rotating rollers/rolls rotating at a defined speed and pressing/fixing the solar-cell/film-web composite together at a defined pressure and at a defined temperature.

32. The method for forming a flexible solar module strand according to claim 1, wherein pressing the first film web and the first encapsulation, if any, to the flexible solar cell strand, and pressing the second film web and the second encapsulation, if any, is effected by means of a roller press having at least one roller/roll and a counter bearing, or two counter-rotating rollers/rolls rotating at a defined speed and pressing a composite of the film webs, the encapsulations, if any, and the flexible solar cell strand together at a defined pressure and at a defined temperature.

* * * * *